United States Patent
Bergenek et al.

(10) Patent No.: US 9,640,739 B2
(45) Date of Patent: May 2, 2017

(54) OPTOELECTRONIC COMPONENT WITH INERT GAS ATMOSPHERE

(71) Applicant: OSRAM GmbH, Munich (DE)

(72) Inventors: Krister Bergenek, Regensburg (DE); Ralph Wirth, Lappersdorf (DE); Axel Kaltenbacher, Mintraching (DE); Andreas Biebersdorf, Regensburg (DE); Joerg Sorg, Regensburg (DE); Christine Maier, Asselfingen (DE); Harald Jaeger, Regensburg (DE); Gertrud Kraeuter, Regenburg (DE); Frank Jermann, Koenigsbrunn (DE); Stefan Lange, Augsburg (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/371,739

(22) PCT Filed: Jan. 8, 2013

(86) PCT No.: PCT/EP2013/050191
§ 371 (c)(1),
(2) Date: Jul. 11, 2014

(87) PCT Pub. No.: WO2013/104606
PCT Pub. Date: Jul. 18, 2013

(65) Prior Publication Data
US 2015/0014711 A1    Jan. 15, 2015

(30) Foreign Application Priority Data
Jan. 11, 2012   (DE) .......................... 10 2012 200327

(51) Int. Cl.
*H01L 29/18* (2006.01)
*H01L 33/56* (2010.01)
(Continued)

(52) U.S. Cl.
CPC .............. *H01L 33/56* (2013.01); *H01L 33/40* (2013.01); *H01L 33/507* (2013.01); *H01L 33/483* (2013.01); *H01L 33/502* (2013.01)

(58) Field of Classification Search
CPC ........ H01L 33/40; H01L 33/56; H01L 33/507
(Continued)

(56) References Cited

U.S. PATENT DOCUMENTS 3,715,636 A    2/1973   Jaffe et al.
7,402,457 B2   7/2008   Häse et al.
(Continued)

FOREIGN PATENT DOCUMENTS

DE         10118630 A1   10/2002
DE       102011003969 A1   8/2012
(Continued)

OTHER PUBLICATIONS

Schnityer et al., "30% external quantum efficiency from surface textured, thin-film light-emitting diodes", Appl. Phys. Lett. 63 (16), Oct. 18, 1993, pp. 2174-2176.
(Continued)

*Primary Examiner* — Hung Vu
(74) *Attorney, Agent, or Firm* — Viering, Jentschura & Partner mbB

(57) ABSTRACT

Various embodiments relate to an optoelectronic component, including a carrier element, on which at least one optoelectronic semiconductor chip is arranged, and a cover, which is mounted on the carrier element in a region extending circumferentially around the semiconductor chip and together with the carrier element forms a sealed cavity in which the at least one optoelectronic semiconductor chip is arranged in an inert gas.

15 Claims, 4 Drawing Sheets

(51) Int. Cl.
*H01L 33/40* (2010.01)
*H01L 33/48* (2010.01)
*H01L 33/50* (2010.01)

(58) Field of Classification Search
USPC .................................. 257/81, 88, 98, 100
See application file for complete search history.

(56) References Cited

U.S. PATENT DOCUMENTS

| | | | |
|---|---|---|---|
| 7,759,754 | B2 | 7/2010 | Gunther et al. |
| 2002/0179919 | A1 | 12/2002 | Deisenhofer et al. |
| 2005/0211900 | A1* | 9/2005 | Ouvrier-Buffet ......... G01J 5/04 250/339.11 |
| 2006/0097245 | A1 | 5/2006 | Aanegola et al. |
| 2009/0127573 | A1 | 5/2009 | Gunther et al. |
| 2010/0164346 | A1* | 7/2010 | Li ........................... F21S 10/02 313/46 |
| 2012/0001214 | A1 | 1/2012 | Ooyabu et al. |
| 2012/0037939 | A1 | 2/2012 | Urano |
| 2012/0175661 | A1 | 7/2012 | Zhou et al. |
| 2013/0037748 | A1* | 2/2013 | Kato ................. C09K 11/7721 252/301.36 |
| 2014/0014995 | A1 | 1/2014 | Pindl et al. |

FOREIGN PATENT DOCUMENTS

| | | | |
|---|---|---|---|
| EP | 1641048 | A1 | 3/2006 |
| EP | 1965445 | A2 | 9/2008 |
| EP | 2048717 | A1 | 4/2009 |
| EP | 2421060 | A1 | 2/2012 |
| JP | 2000-31547 | * | 1/2000 |
| JP | 2000031547 | A | 1/2000 |
| WO | 03003247 | A2 | 4/2003 |
| WO | 2005050746 | A2 | 6/2005 |
| WO | 2006034671 | A2 | 4/2006 |
| WO | 2010119830 | A1 | 10/2010 |
| WO | 2011035483 | A1 | 3/2011 |

OTHER PUBLICATIONS

English abstract of JP 2000031547 A of Jan. 28, 2000.
International Search Report issued in the corresponding PCT application No. PCT/EP2013/050191, dated May 16, 2013.
Office Action issued in the corresponding German application No. 102012200327.4, dated Oct. 26, 2012.

* cited by examiner

OPTOELECTRONIC COMPONENT WITH INERT GAS ATMOSPHERE

RELATED APPLICATIONS

The present application is a national stage entry according to 35 U.S.C. §371 of PCT application No.: PCT/EP2013/050191 filed on Jan. 8, 2013, which claims priority from German application No. 10 2012 200 327.4 filed on Jan. 11, 2012, and is incorporated herein by reference in its entirety.

TECHNICAL FIELD

An optoelectronic component is specified.

BACKGROUND

Light-emitting diode components including one or more light-emitting diode chips (LED chips; LED: "light-emitting diode") in a housing, so-called LED packages, and lighting modules including LED chips, which are also designated as light engines, are used in a multiplicity of display and lighting applications. However, customary light-emitting diode components often have component parts which tend toward degradation of desired properties in an environment including, for example, oxygen gas, hydrogen sulfide and/or exhibiting moisture and/or having a high temperature. Such component parts susceptible to degradation may be, for example, the LED chips, silicone used as housing or potting material, a mirror material such as, for instance, silver and/or a phosphor for wavelength conversion.

In order to avoid for example the degradation of silver mirror layers by oxidation or other chemical reactions with ambient gases and reliability problems associated therewith, silver with an admixture of an additive that reduces the degradation is usually used rather than pure silver, even though pure silver has a higher reflectivity.

Phosphors which are advantageous with regard to their emission spectrum and which degrade for example as a result of oxygen and/or moisture cannot be used at the present time.

By contrast, customary LED packages and light engines in which silicone is used have to be operated at temperatures that are typically below approximately 150° C., in order to avoid thermo-oxidation and further crosslinking of the silicone.

SUMMARY

Various embodiments specify an optoelectronic component for whose component parts a lower risk with regard to degradation by ambient gases is achieved.

In accordance with at least one embodiment, an optoelectronic component includes a carrier element, on which at least one optoelectronic semiconductor chip is arranged. A cover is arranged above the optoelectronic semiconductor chip, said cover being mounted on the carrier element in a region extending circumferentially around the semiconductor chip. The carrier element and the cover form a sealed cavity in which the at least one optoelectronic semiconductor chip is arranged.

Here and hereinafter, a "circumferentially extending region" denotes a region which, in particular in a lateral direction, that is to say in a direction along the surface of the carrier element on which the at least one optoelectronic semiconductor chip is arranged, encloses and completely surrounds the optoelectronic semiconductor chip.

In accordance with a further embodiment, the cavity is filled with an inert gas. The gas can be formed, for example, by argon, neon or nitrogen or a mixture thereof. Particularly preferably, the cavity does not include any gas that is damaging to the component parts of the optoelectronic component, such as, for example, an ambient gas selected from oxygen, moisture, hydrogen sulfide and $CO_2$. In other words, this means that the cavity is as free as possible of such damaging gases. In this case, "as free as possible" means that the cavity may still contain residues of such damaging gases which for example cannot be removed in the context of production of the optoelectronic component for technical reasons or which for example are concomitantly introduced as impurities of the inert gas during the process of filling the cavity with the inert gas.

In accordance with a further embodiment, the cavity is sealed hermetically impermeably relative to the environment of the optoelectronic component. In this case, "hermetically impermeably" means that no or only very little gas exchange can take place between the cavity and the environment of the optoelectronic component, such that over the lifetime of the optoelectronic component damaging substances or gases from the environment cannot penetrate into the cavity at all or can penetrate into the cavity only to such a small extent that they cannot lead to considerable degradation of one or more component parts of the optoelectronic component within the cavity. Such damaging substances from the environment can be formed, in particular, by oxygen gas, hydrogen sulfide, moisture or carbon dioxide.

Consequently, in the case of the optoelectronic component described here, it is advantageously possible to use within the cavity of the optoelectronic component parts which cannot be used in conventional LED packages or in light engines, since they can be damaged therein by ambient gases.

Furthermore, it may also be possible, owing to the absence of chemical degradation processes in the cavity which might be brought about by the ambient gases, for the optoelectronic component described here to be operated at higher temperatures than known components. By way of example, the optoelectronic component may include a silicone material, for example as matrix material for a wavelength conversion substance in the form of a coating on the at least one optoelectronic semiconductor chip or some other location in the cavity, and nevertheless be operated at a temperature of more than 150 degrees, since the thermo-oxidation of silicone that can be observed in the case of known components at temperatures above 150° C. cannot take place in the cavity of the optoelectronic component described here.

If, instead of the silicone, for example ceramic materials or glass materials are used, for example as wavelength conversion substance or as matrix material for a wavelength conversion substance, then the operating temperature of the optoelectronic component described here can even be increased still further. With the same precautions for heat dissipation as in conventional LED packages or light engines, for example by means of a heat sink provided, the optoelectronic component described here, in comparison with the conventional components, can thus be operated at higher current densities leading to higher temperatures, without the component parts of the component within the cavity degrading. Thus, for example in the case of semiconductor chips designed to emit light in the cavity of the optoelectronic component, it is possible to increase the luminous intensity per chip area, as a result of which it is possible to achieve a reduction of the costs per luminous flux in lumens. Furthermore, the optoelectronic component described here can also be operated in particularly sensitive environments since no damaging volatile gases are emitted by the optoelectronic component described here. Furthermore, it is also possible to sterilize the optoelectronic component.

In accordance with a further embodiment, the at least one optoelectronic semiconductor chip includes a semiconductor layer sequence. In particular, the optoelectronic semiconductor chip includes an inorganic semiconductor layer sequence. The semiconductor chip can be embodied as a light-emitting semiconductor chip or as a light-detecting semiconductor chip, for example in the form of a photodiode or a photovoltaic cell. The semiconductor chip may include a semiconductor layer sequence based on different inorganic semiconductor material systems depending on the wavelength. For example a semiconductor layer sequence based on $In_xGa_yAl_{1-x-y}As$, is suitable for long-wave, infrared to red radiation, for example a semiconductor layer sequence based on $In_xGa_yAl_{1-x-y}P$ is suitable for red to yellow radiation, and for example a semiconductor layer sequence based on $In_xGa_yAl_{1-x-y}N$ is suitable for short-wave visible, that is to say in particular for green to blue, and/or for UV radiation, wherein in each case $0 \leq x \leq 1$ and $0 \leq y \leq 1$ hold true. Furthermore, a semiconductor layer sequence based on an antimonide, for example InSb, GaSb, AlSb or a combination thereof, can be suitable for long-wave infrared radiation.

Particularly preferably, the at least one inorganic semiconductor chip may include or be composed of an epitaxially grown semiconductor layer sequence. For this purpose, the semiconductor layer sequence can be grown by means of an epitaxy method, for example metal organic vapor phase epitaxy (MOVPE) or molecular beam epitaxy (MBE), on a growth substrate and can be provided with electrical contacts. A plurality of semiconductor chips can be provided by the singulation of the growth substrate with the grown semiconductor layer sequence.

Furthermore, the semiconductor layer sequence may be transferred to a carrier substrate prior to singulation and the growth substrate may be thinned or completely removed. Such semiconductor chips including, as substrate, a carrier substrate instead of the growth substrate can also be designated as so-called thin-film semiconductor chips.

A thin-film semiconductor chip is distinguished, in particular, by the following characteristic features:
  a reflective layer is applied or formed at a first main surface—facing toward the carrier substrate—of a radiation-generating epitaxial layer sequence, said reflective layer reflecting at least part of the electromagnetic radiation generated in the epitaxial layer sequence back into the latter;
  the epitaxial layer sequence has a thickness in the range of 20 μm or less, in particular in the range of between 4 μm and 10 μm; and
  the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A thin-film semiconductor chip is a Lambertian surface emitter to a good approximation. The basic principle of a thin-film light-emitting diode chip is described for example in the document I. Schnitzer et al., Appl. Phys. Lett. 63 (16), Oct. 18, 1993, 2174-2176.

In accordance with a further embodiment, the at least one optoelectronic semiconductor chip is embodied as a thin-film semiconductor chip and has a reflective layer embodied as a silver layer. In particular, the reflective layer may include pure silver. In this connection, "pure silver" means that the reflective layer consists of silver, wherein unavoidable impurities may be admixed with the silver within the scope of the technically possible purity. In contrast to known reflective layers including, in addition to the silver, an intentionally added material which may reduce a degradation of silver owing to an oxidation or other chemical reactions with ambient gases, the reflective layer composed of the pure silver includes no material intentionally added to the silver.

In accordance with a further embodiment, a reflective layer, in particular a silver layer composed of pure silver, is arranged on that surface of the carrier element which faces the at least one optoelectronic semiconductor chip.

The use of a silver layer as a reflective layer in at least one optoelectronic semiconductor chip and/or as a reflective layer on the carrier element can lead to an increased efficiency of the optoelectronic component as a result of the high reflectivity of pure silver in comparison with mixtures or alloys of silver with other materials. Since the reflective layer of the optoelectronic semiconductor chip and/or the reflective layer on the carrier element are/is arranged within the cavity formed by the carrier element and the cover, degradation of the silver by ambient gases can be effectively prevented, such that the reflective layer can also have a high reliability besides the high efficiency.

In accordance with a further embodiment, the optoelectronic component includes a plurality of optoelectronic semiconductor chips which can be arranged for example in a matrix-like arrangement as a so-called semiconductor chip array. The semiconductor chips can be embodied in each case identically or differently. By way of example, the semiconductor chips can all be embodied as light-emitting semiconductor chips which can emit light having in each case the same color impression or having different color impressions.

In accordance with a further embodiment, the carrier element is formed by a ceramic material, a glass material, a metal or a combination thereof. That may mean, in particular, that the carrier element has a main body composed of one or more of the abovementioned materials, which main body is responsible for the mechanical properties and the stability of the carrier element. The carrier element may include further materials, for example in the form of at least one solder layer, conductor track, electrical via, mirror layer and/or insulating layer, on or in the main body.

In accordance with a further embodiment, the carrier element is formed by a ceramic material. By way of example, the carrier element may include a ceramic layer or can be formed by a ceramic layer. As an alternative thereto, the carrier element may also be formed as a ceramic multilayer element including at least two ceramic layers. In particular, by means of a plurality of ceramic layers in a ceramic multilayer element, a three-dimensional structure of the carrier element can be achieved, while a carrier element composed of only one ceramic layer is preferably embodied in a planar fashion. A three-dimensionally shaped carrier element may have for example a depression in which the at least one optoelectronic semiconductor chip is arranged. The depression may be formed for example by at least two ceramic layers being arranged one above another, of which one has an opening extending through to the other ceramic layer.

In accordance with a further embodiment, the carrier element includes as ceramic material aluminum nitride, aluminum oxide, silicon carbide, tungsten carbide or a mixture or combination thereof.

In accordance with a further embodiment, the carrier element includes a metal layer, a metal body or a metal plate or is formed thereby, on which a dielectric layer, for example composed of glass, for instance a thin glass layer, is applied. The dielectric layer, that is to say the glass layer, for example, then preferably forms the top side of the carrier element facing the optoelectronic semiconductor chip.

In accordance with a further embodiment, the carrier element has contact structures, for example conductor tracks, electrical terminal regions or elements or electrical circuits. Particularly preferably, the contact structures are implemented by means of a planar connection technique, as described for example in the documents WO 2003/030247 A2, WO 2005/050746 A2 and WO 2006/034671 A2, the disclosure content of which in this regard within the full scope is incorporated by reference.

In accordance with a further embodiment, at least the carrier element or at least the cover or both the carrier element and the cover has/have a depression by which the cavity is formed. By way of example, the carrier element may be embodied in a planar fashion and the cover may have a depression for forming the cavity. As an alternative thereto, it is also possible for the carrier element to have a depression in which the at least one optoelectronic semiconductor chip is arranged, and for the cover to be embodied in a planar fashion. As an alternative thereto, it is also possible both for the carrier element to have a depression with the at least one optoelectronic semiconductor chip and for the cover to have a further depression, which together form the cavity.

In accordance with a further embodiment, the cover is transmissive to light. That may mean, in particular, that the cover is transparent or translucent. By way of example, the cover above the at least one optoelectronic semiconductor component can be embodied in a planar fashion, for example in a plate-shaped fashion. Particularly in the case of one or a plurality of semiconductor chips designed to emit light in the cavity, it can also be advantageous if the cover has an at least partly curved surface. By way of example, the outer surface of the cover facing away from the at least one semiconductor chip may be formed in a lens-shaped fashion. Furthermore, it may also be possible for the cover to be embodied for example in a dome-like fashion, for instance in the form of part of a spherical shell.

In accordance with a further embodiment, the cover includes a ceramic material and/or a glass material or is formed therefrom. By way of example, the cover may include a ceramic material mentioned above in connection with the carrier element. Furthermore, the cover may include a wavelength conversion substance, for example as described further below, or can be formed therefrom.

In accordance with a further embodiment, the cover is arranged and mounted on the carrier element by means of a connection layer. The connection layer, which is embodied for example as circumferentially extending metallization or circumferentially extending glass solder, is arranged in particular between the cover and the circumferentially extending region of the carrier element. By way of example, the cover may include a circumferentially extending metallization or a circumferentially extending glass solder as a connection layer for mounting on the circumferentially extending region of the carrier element. Such materials are suitable in particular for connecting ceramic and/or glass materials to one another. By way of example, the metallization may be formed by a layer sequence including tungsten, nickel and silver or including tungsten, nickel and tin or including tungsten and NiPdAu. By means of such a connection layer, the cover may be sintered or soldered on the carrier element. Furthermore, it is also possible for the cover to be fixed on the carrier element with a glass solder, also designated as glass frit, as connection material by means of sintering and/or by means of fusion.

In accordance with a further embodiment, the optoelectronic component includes one or a plurality of wavelength conversion substances, designated hereinafter as wavelength conversion substance. The wavelength conversion substance may be suitable in particular for at least partly absorbing the light emitted by at least one optoelectronic semiconductor chip designed to emit light and for emitting it as light having a wavelength range that is at least partly different than the emitted light. The wavelength conversion substance may be selected from: garnets doped with rare earth metals, alkaline earth metal sulfides doped with rare earth metals, thiogallates doped with rare earth metals, alkaline earth metal silicon aluminum nitrides doped with rare earth metals, aluminates doped with rare earth metals, silicates doped with rare earth metals, such as orthosilicates, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals, sialons.

In accordance with a further embodiment, the cover includes a wavelength conversion substance. In particular, the cover may include a wavelength conversion substance on a surface facing the at least one optoelectronic semiconductor chip. In other words, a wavelength conversion substance can be arranged within the cavity on an inner side of the cover. By way of example, the wavelength conversion substance can be applied on the cover for example in the form of a powder layer or in a manner embedded into a matrix material, for example silicone. Alternatively or additionally, a wavelength conversion substance can also be contained in a material of the cover. That can mean, for example, that the cover includes a matrix material, for example a glass or a ceramic, in which a wavelength conversion substance is embedded. That may also mean that the cover may for example also be formed at least partly or completely by the wavelength conversion substance.

Alternatively or additionally, a wavelength conversion substance can also be arranged within the cavity, for example on the at least one optoelectronic semiconductor chip.

In accordance with a further embodiment, the wavelength conversion substance includes one or a plurality of garnets, or is formed therefrom, for example $(Y, Lu, Gd, Tb)_3(Al, Ga, Sc)_5O_{12}$, for instance yttrium aluminum oxide (YAG) and/or lutetium aluminum oxide (LuAG), and/or group II-VI garnets such as $(Ca, Lu)_3(Sc, Mg, Na, Li)_2Si_3O_{12}$, which is doped for example with one of the following activators: cerium, europium, terbium, praseodymium, samarium, manganese. By way of example, the wavelength conversion substance may include or be YAG:Ce and/or LuAG:Ce. In this case, it may be possible that the wavelength conversion substance partly or completely forms the cover.

Furthermore, it may also be possible for the cover to be formed by a transparent or translucent ceramic, for example $Al_2O_3$, or an undoped garnet, for example undoped YAG or undoped LuAG. In this case, a wavelength conversion substance can be arranged on one of the surfaces of the cover or within the cavity.

In the case of an arrangement of the wavelength conversion substance on the inner side of the cover within the cavity or else within the material of the cover or else within the cavity in a manner spaced apart from the cover, it is also possible to use conversion substances having a high efficiency and particularly suitable spectral properties which are very sensitive to damaging substances. By way of example, a wavelength conversion substance based on a thiogallate, sulfide and/or thioaluminate, for example a wavelength conversion substance having the formula $AGa_2S_4$:Eu or AS:Eu, wherein A denotes an alkaline earth metal ion, can be used. Such a wavelength conversion substance, which can have a narrowband emission upon excitation by blue light, can degrade very rapidly in the presence of moisture or water as a result of hydrolysis. Furthermore, by way of example, as wavelength conversion substance it is also possible to use (Sr, Ca)$AlSiN_3$:Eu, which can degrade on account of the humidity in the case of a high ratio of the proportion of Sr to the proportion of Ca. With the use of such a wavelength conversion substance, the possible emission spectrum has been very limited heretofore, since the ratio of Sr to Ca determines not only the emission wavelength but also the tendency to degrade in moisture. Furthermore, the wavelength conversion substance may include $A_2SiO_4$:Eu or $A_3SiO_5$:Eu, wherein A denotes an alkaline earth metal ion, which can readily react with moisture and/or $CO_2$. Furthermore, the wavelength conversion substance may also include a II-VI compound semiconductor material, for example applied as a layer, for example CdMgZnSe, which has a very high efficiency and a narrowband emission, but which also degrades very rapidly in air. Furthermore, it is also possible to use as wavelength conversion substance so-called quantum dots, for example InP, CdSe, CdTe, copper-doped InP, Mn—Cu-doped ZnSe or $CuInS_2$, all of which are very sensitive to oxidation.

In accordance with a further embodiment, the cover includes a wavelength conversion substance on a surface facing away from the at least one optoelectronic semiconductor chip. In particular, on the outer side of the cover arranged outside the cavity with the inert gas, it is possible to use a wavelength conversion substance which is insensitive to the ambient gases.

Consequently, in the case of the optoelectronic component described here, it is possible to use both wavelength conversion substances that are sensitive to the environment and wavelength conversion substances that are insensitive to the environment, and to arrange them depending on their degradation properties within the cavity in the inert gas, within the material of the cover or else, in the case of insensitive wavelength conversion substances, outside the cover on that side of the cover which faces away from the semiconductor chip.

In accordance with a further embodiment, the cover includes a polymer material. In this case, the cover, particularly preferably for mounting on the circumferentially extending region of the carrier element, can be applied on the carrier element by means of a connection layer composed of an adhesive.

In accordance with a further embodiment, the polymer material includes polymethyl methacrylate (PMMA), polycarbonate (PC), silicone or a mixture or combination thereof or is composed of one of said materials. PMMA is particularly suitable for an application in a temperature range of up to 90° C., PC up to 120° C. and silicone up to 150° C.

In particular, in the case of a polymer material, the cover can be free of wavelength conversion substances on account of the lower heat conduction properties of the polymer material in comparison with a glass or ceramic material. In this case, a wavelength conversion substance, for example one of the wavelength conversion substances mentioned above, can be applied for example directly on the at least one optoelectronic semiconductor chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

In the embodiments and figures, elements that are identical, of identical type or act identically may be provided with the same reference signs in each case. The illustrated elements and their size relationships among one another should not be regarded as true to scale; rather, individual elements such as, for example, layers, structural parts, components and regions may be illustrated with an exaggerated size in order to enable better illustration and/or in order to afford a better understanding.

Figure 1A:
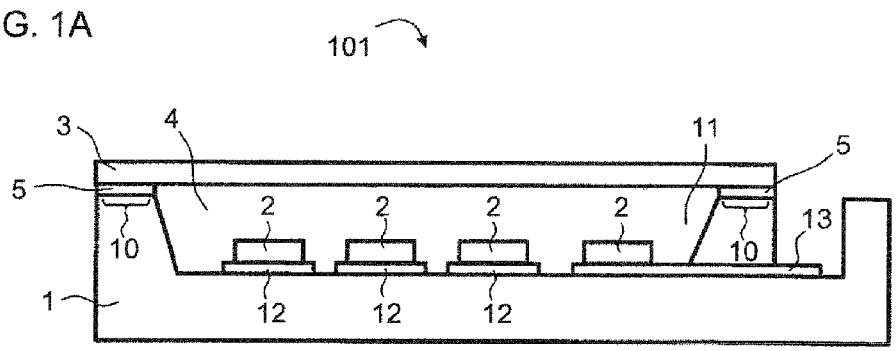
FIGS. 1A and 1B show schematic illustrations of an optoelectronic component in accordance with one embodiment.
Figure 1B:
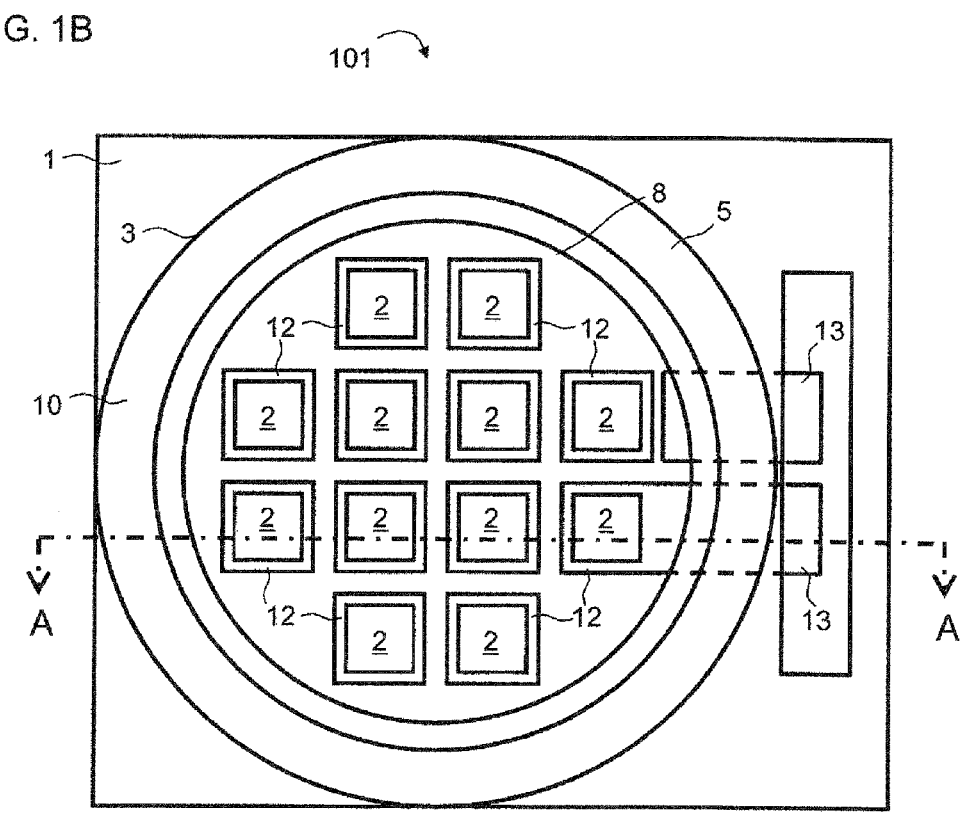

FIGS. 1A and 1B show an embodiment of an optoelectronic component 101. In this case, FIG. 1A corresponds to a sectional illustration through the optoelectronic component 101 in accordance with the sectional plane A-A in FIG. 1B. FIG. 1B illustrates a plan view of the optoelectronic component 101 from above, that is to say looking at the cover 3.

The optoelectronic component 101 includes a carrier element 1, which is embodied as a ceramic multilayer element having at least two ceramic layers in the embodiment shown. The carrier element 1 may include as ceramic material for example AlN, $Al_2O_3$, SiC or WC or a combination thereof. The at least two ceramic layers of the carrier element 1 are sintered with one another in order to form the carrier element 1, wherein at least one ceramic layer has an opening extending to the underlying ceramic layer, such that the carrier element 1 is embodied as a three-dimensional carrier element having a depression 11 in which at least one optoelectronic semiconductor chip 2 is arranged.

In the embodiment shown, the optoelectronic component 101 includes a plurality of optoelectronic semiconductor chips 2 on the carrier element 1. In this embodiment and also in the subsequent embodiments, purely by way of example, the optoelectronic semiconductor chips 2 are embodied as light-emitting semiconductor chips, such that the optoelectronic component 101 in the embodiment shown and also the optoelectronic components 102, 103, 104 in accordance with the subsequent embodiments, purely by way of example, are embodied as light-emitting components.

In this case, as described in the general part, the semiconductor chips 2 can be embodied as thin-film semiconductor chips, for example. In particular, the optoelectronic semiconductor chips 2 in the embodiment shown are embodied as thin-film semiconductor chips, as explained in the general part, having a reflective mirror layer embodied as a silver layer.

As an alternative thereto, it is also possible for one or a plurality of semiconductor chips 2 or else all of the semiconductor chips 2 to be embodied as light-receiving semiconductor chips, for example.

The number and the arrangement of the optoelectronic semiconductor chips 2 should be understood to be purely by way of example in the embodiments shown. As an alternative to the number and arrangement shown, the optoelectronic component 101 in the embodiment in FIGS. 1A and 1B and also the optoelectronic components 102, 103, 104 in the subsequent embodiments may also include more or fewer optoelectronic semiconductor chips 2 and also a different arrangement thereof. The optoelectronic semiconductor chips 2 are arranged on a contact structure 12 in the form of contact pads and are electrically interconnected with one another by means of the contact structure 12. The interconnection of the optoelectronic semiconductor chips 2 can preferably be embodied by means of a planar connection technique, as described above in the general part. Outside the depression 11, the contact structure 12 has two terminal elements 13 for connecting the optoelectronic semiconductor chips 2 and thus the optoelectronic component 101. Additionally, further electronic components and/or interconnection structures and/or insulating layers for the interconnection of the optoelectronic semiconductor chips 2 can be present on or in the carrier element 1.

Furthermore, the optoelectronic semiconductor chips 2 are arranged on a reflective layer, which is embodied as a silver layer 8, on the carrier element 1. The silver layer 8 is not shown here in FIG. 1A, for the sake of clarity.

A cover 3 is arranged above the optoelectronic semiconductor chips 2. The cover 3 is mounted, by means of a connection layer 5, on a region 10 of the carrier element 1 which extends circumferentially around the semiconductor chips 2. As a result, the cover 3 and the carrier element 1 having the depression 11 form a cavity 4 in which the optoelectronic semiconductor chips 2 and the mirror layer 8 are arranged. In this case, the carrier element 1, the cover 3 and the connection layer 5 form a hermetically impermeable cavity 4 for the component parts arranged therein, such that as far as possible no gas exchange with the environment of the optoelectronic component 101 can take place.

In the embodiment shown, the connection layer 5 is formed by a metallization, for example a layer sequence including tungsten, nickel and silver or including tungsten, nickel and tin or including tungsten and NiPdAu, which is applied on the cover 3 and which connects the cover 3 to the carrier element 1 in the circumferentially extending region 10 by means of a sintering or by means of soldering.

The cavity 4 is filled with an inert gas, for example with Ar, Ne, $N_2$ or a mixture thereof. In particular, the cavity 4 is as free as possible of damaging substances, for example oxygen, hydrogen sulfide, moisture or carbon dioxide. As a result, it is possible to use the optoelectronic semiconductor chips 2 with a reflective layer composed of silver and the silver layer 8 on the carrier element 1 without the risk of degradation of these elements that might be brought about by damaging ambient gases.

The cover 3 is embodied such that it is at least partly transmissive to light, that is to say transparent or translucent, and is formed by a glass or ceramic material. By way of example, the cover 3 can be formed by a light-transmissive ceramic, for example aluminum oxide, undoped YAG or undoped LuAG.

As an alternative thereto, the cover can for example also include a wavelength conversion substance or be formed therefrom, preferably one or a plurality of garnets such as, for instance, $(Y, Lu, Gd, Tb)_3(Al, Ga, Sc)_5O_{12}$, for instance yttrium aluminum oxide (YAG) and/or lutetium aluminum oxide (LuAG), and/or group garnets such as $(Ca, Lu)_3(Sc, Mg, Na, Li)_2Si_3O_{32}$, which is doped for example with one of the following activators: cerium, europium, terbium, praseodymium, samarium, manganese. By way of example, the wavelength conversion substance may include YAG:Ce and/or LuAG:Ce or be composed thereof.

Figure 2A:
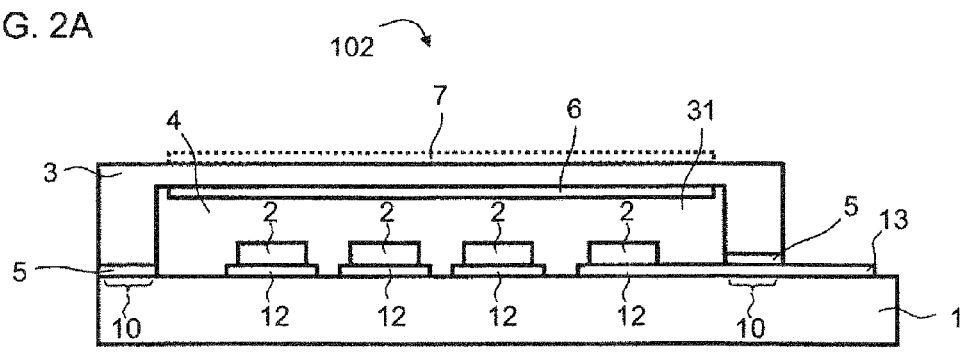
FIGS. 2A and 2B show schematic illustrations of an optoelectronic component in accordance with a further embodiment.
Figure 2B:
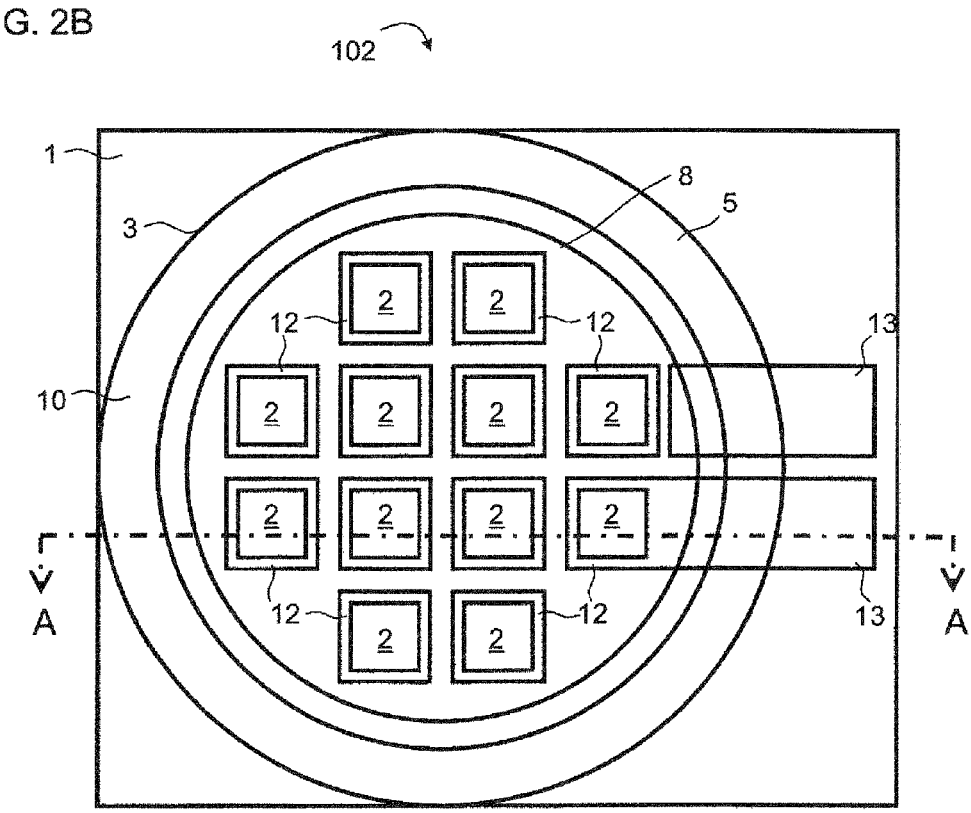

As shown in connection with the subsequent embodiment in FIGS. 2A and 2B, a wavelength conversion substance 6, 7 can additionally be applied on the cover 3.

Furthermore, it is also possible for one or a plurality or all of the optoelectronic semiconductor chips 2 in each case to include a wavelength conversion substance for example in the form of a coating. Such a coating may be formed for example by a powder coating or by a matrix material, for example silicone, including the wavelength conversion substance.

It is also possible for the cover 3 to be formed from a polymer material that is mounted on the circumferentially extending region 10 of the carrier element 1 by means of a connection layer 5 formed from an adhesive. On account of the lower heat-dissipating properties of a polymer material in comparison with glass or ceramic, the cover 3 in the case of a polymer material is preferably free of a wavelength conversion substance.

Modifications of the optoelectronic component 101 from FIGS. 1A and 1B in accordance with further embodiments are shown in the subsequent figures. Therefore, principally the differences relative to the embodiment in FIGS. 1A and 1B are discussed in the description of the subsequent embodiments.

FIGS. 2A and 2B show an optoelectronic component 102 in accordance with a further embodiment, which, in comparison with the embodiment in FIGS. 1A and 1B, includes a carrier element 1 formed from an individual ceramic layer. As an alternative thereto, the carrier element 1 may for example also include a metal layer or a metal plate covered with a thin glass dielectric layer on the side facing the optoelectronic semiconductor chips 2.

In comparison with the previous embodiment, in which the cover 3 is embodied in a planar fashion, the cover 3 is embodied with a three-dimensional structure and in particular with a depression 31. The cover 3 can for example be composed of glass or include a glass. The cavity 4 is thus formed by the depression 31 of the cover 3, which is enclosed by the cover 3 and the carrier element 1. In the embodiment shown, the connection layer 5 between the cover 3 and the carrier element 1 is formed from an insulating material, in particular from glass or a glass solder, by which the cover 3 is fixed on the circumferentially extending region 10 of the carrier element 1 by means of sintering or fusion.

In the embodiment shown, the cover 3 furthermore includes a wavelength conversion substance 6 applied in the form of a layer on the inner side facing the optoelectronic semiconductor chips 2. The wavelength conversion substance 6 may be applied for example in the form of a powder coating or in a manner embedded into a matrix material such as silicone, for example.

By virtue of the fact that the wavelength conversion substance 6 is arranged within the cavity 4 with the inert gas, said wavelength conversion substance may also include a material that is sensitive to damaging substances in the environment. By way of example, the wavelength conversion substance 6 may include one or more of the wavelength conversion substances sensitive to ambient gases and mentioned above in the general part, for example one or more selected from: $AGa_2S_4$:Eu, AS:Eu, $A_2SiO_4$:Eu, $A_3SiO_5$:Eu, wherein A in each case denotes an alkaline earth metal ion, (Sr, Ca)$AlSiN_3$:Eu, a II-VI compound semiconductor material such as, for instance, CdMgZnSe, a quantum dot material such as, for instance, InP, CdSe, CdTe, Cu-doped InP, Mn—Cu-doped ZnSe, $CuInS_2$. All these wavelength conversion substances, as described above in the general part, are sensitive to gases in the environment, for example oxygen, moisture or $CO_2$, and can be used in the optoelectronic component 102 described here within the cavity 4 in the inert gas without the risk of degradation.

As an alternative or in addition to the wavelength conversion substance 6 on the inner side of the cover 3, one or a plurality of wavelength conversion substances can also be embedded in the material of the cover 3.

Furthermore, as indicated by the dotted line, a further wavelength conversion substance 7 can also be arranged on the outer side of the cover 3 facing away from the optoelectronic semiconductor chips 2, said further wavelength conversion substance being formed from a material that is insensitive to damaging substances in the environment.

Figure 3A:
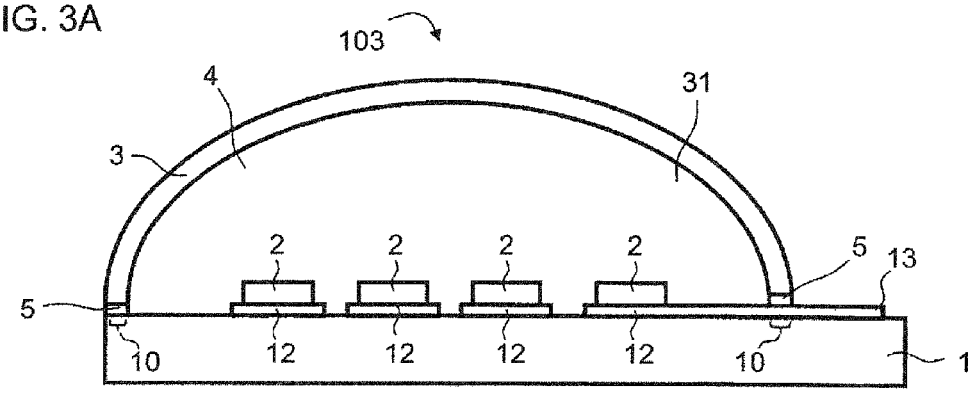
FIGS. 3A and 3B show schematic illustrations of an optoelectronic component in accordance with a further embodiment.
Figure 3B:
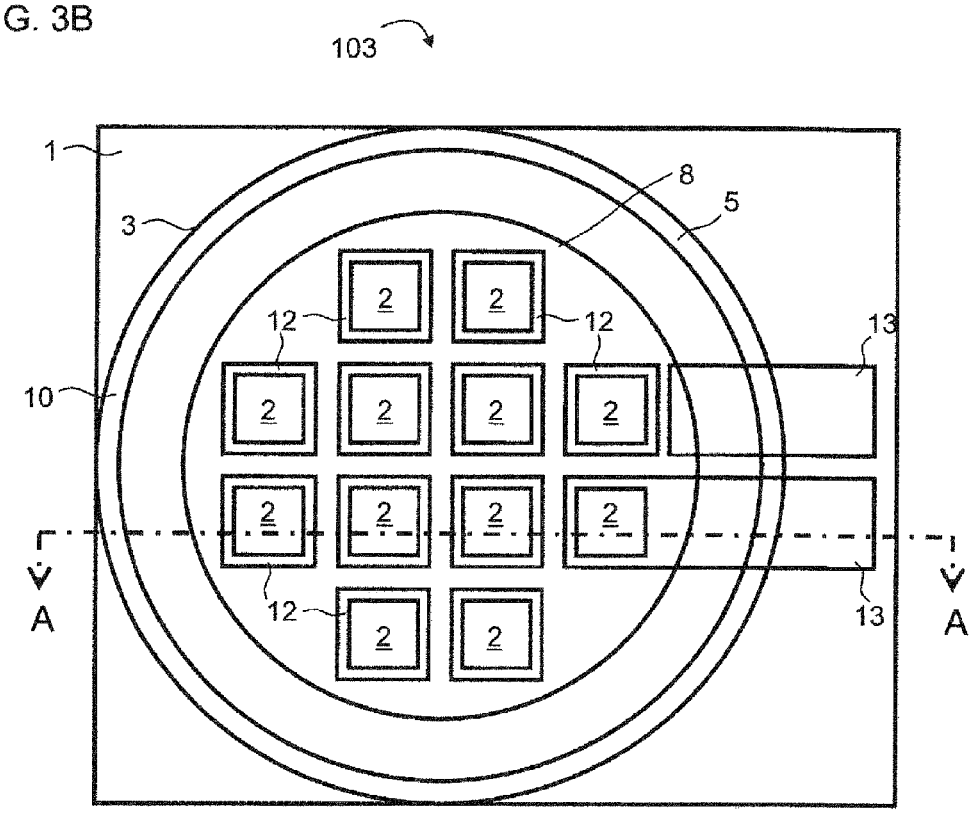

FIGS. 3A and 3B show a further embodiment of an optoelectronic component 103, which includes a cover 3 having a depression 31 which, in comparison with the previous embodiment, does not form a planar surface above the optoelectronic semiconductor chips 2, but rather is embodied in the form of a dome or of part of a spherical shell.

Furthermore, it is also possible that the cover is embodied for example at least partly in a lens-like fashion and can thus influence the emission characteristic of the optoelectronic component 103. As described in connection with the previous embodiments, the cover 3 may include a wavelength conversion substance in the material of the cover itself, on the inner side facing the optoelectronic semiconductor chips 2, or on the outer side facing away from the optoelectronic semiconductor chips 2.

Figure 4A:
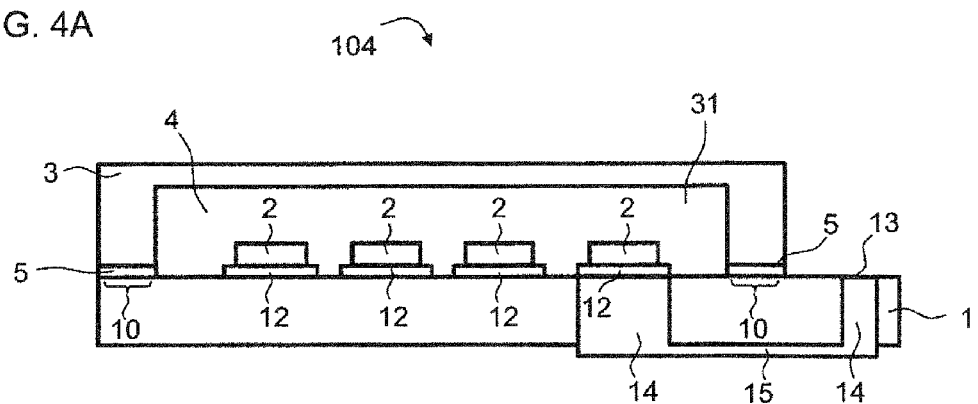
FIGS. 4A and 4B show schematic illustrations of an optoelectronic component in accordance with a further embodiment.
Figure 4B:
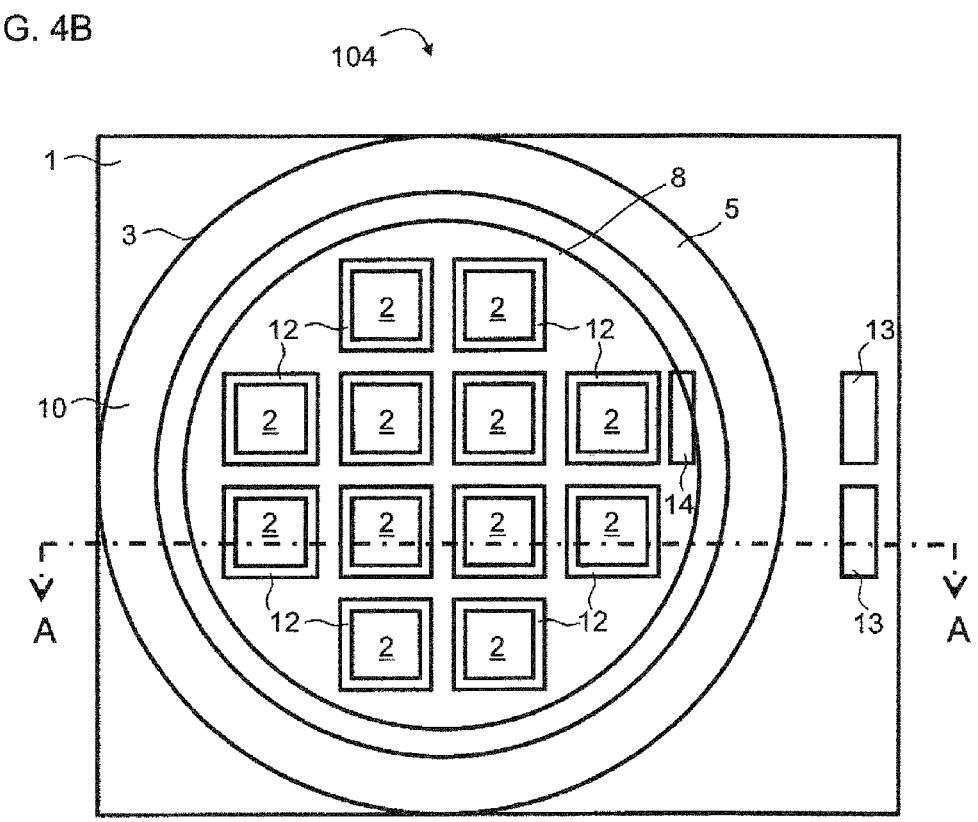

FIGS. 4A and 4B show a further embodiment of an optoelectronic component 104, wherein, unlike in the previous embodiments, the contact structure 12 is not led through toward the outside between the cover 3 and the carrier element 1. Rather, the optoelectronic component 104 includes so-called vias 14, which connect the contact structure 12 within the cavity 4 to terminal elements 13 outside the cavity 4 by means of a contact structure 15 on the rear side of the carrier element 1 facing away from the optoelectronic semiconductor chips 2. As a result, it is possible to use as connection material 5 between the carrier element 1 and the cover 3, instead of an insulating material such as a glass or glass solder, for instance, an electrically conductive material such as a metallization, for example, as described in connection with FIGS. 1A and 1B.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component comprising:
a carrier element, on which at least one optoelectronic semiconductor chip is arranged, and
a cover sintered or soldered on the carrier element in a region extending circumferentially around the semiconductor chip and together with the carrier element forms a sealed cavity in which the at least one optoelectronic semiconductor chip is arranged in an inert gas; wherein at least one wavelength conversion substance is embedded in the cover.

2. The optoelectronic component as claimed in claim 1, wherein the at least one semiconductor chip comprises a reflective layer comprising silver.

3. The optoelectronic component as claimed in claim 2, wherein the reflective layer faces the carrier.

4. The optoelectronic component as claimed in claim 1, wherein the carrier element is formed by a ceramic material, a glass material, a metal or a combination thereof.

5. The optoelectronic component as claimed in claim 1, wherein the inert gas is formed by Ar, Ne, $N_2$ or a mixture thereof.

6. The optoelectronic component as claimed in claim 1, wherein the carrier element is planar and the cover has a depression for forming the cavity.

7. The optoelectronic component as claimed in claim 1, wherein the cover comprises a ceramic material and/or glass material.

8. The optoelectronic component as claimed in claim 7, wherein a circumferentially extending connection layer formed from a metallization or a glass solder is arranged between the cover and the circumferentially extending region of the carrier element.

9. The optoelectronic component as claimed in claim 8, wherein the metallization is formed by a layer sequence comprising tungsten, nickel and silver or comprising tungsten, nickel and tin or comprising tungsten and NiPdAu.

10. The optoelectronic component as claimed in claim 7, wherein the cover comprises a wavelength conversion substance on a surface of the cover which faces the at least one optoelectronic semiconductor chip and/or in a material of the cover.

11. The optoelectronic component as claimed in claim 10, wherein the cover is at least partly formed by a wavelength conversion substance.

12. The optoelectronic component as claimed in claim 7, wherein the cover comprises a wavelength conversion substance on a surface facing away from the at least one optoelectronic semiconductor chip.

13. The optoelectronic component as claimed in claim 1, wherein the cover comprises a polymer material.

14. The optoelectronic component as claimed in claim 1, wherein a silver layer is arranged on that surface of the carrier element which faces the at least one optoelectronic semiconductor chip, and/or the at least one optoelectronic semiconductor chip comprises a silver layer.

15. The optoelectronic component as claimed in claim 1, further comprising at least one via configured to connect the at least one optoelectronic semiconductor chip to an element outside the cavity.

* * * * *

UNITED STATES PATENT AND TRADEMARK OFFICE
CERTIFICATE OF CORRECTION

PATENT NO. : 9,640,739 B2
APPLICATION NO. : 14/371739
DATED : May 2, 2017
INVENTOR(S) : Krister Bergenek et al.

Page 1 of 1

It is certified that error appears in the above-identified patent and that said Letters Patent is hereby corrected as shown below:

On the Title Page

(72) Inventor Gertrud Kraeuter: Please delete the city name "Regenburg" and write "Regensburg" in place thereof.

In the Specification

Column 10, Line 15: Please insert the numbers --II VI-- between the words "group" and "garnets".

Signed and Sealed this
Fourth Day of July, 2017

Joseph Matal
*Performing the Functions and Duties of the*
*Under Secretary of Commerce for Intellectual Property and*
*Director of the United States Patent and Trademark Office*